US007355922B2

(12) United States Patent
Johnson et al.

(10) Patent No.: US 7,355,922 B2
(45) Date of Patent: Apr. 8, 2008

(54) METHOD AND APPARATUS FOR INITIALIZATION OF READ LATENCY TRACKING CIRCUIT IN HIGH-SPEED DRAM

(75) Inventors: James Brian Johnson, Boise, ID (US); Brent Keeth, Boise, ID (US); Feng (Dan) Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 11/429,856

(22) Filed: May 8, 2006

(65) Prior Publication Data
US 2006/0198237 A1    Sep. 7, 2006

Related U.S. Application Data

(63) Continuation of application No. 10/910,838, filed on Aug. 4, 2004, now Pat. No. 7,065,001.

(51) Int. Cl.
*G11C 8/00* (2006.01)
*H03L 7/06* (2006.01)
(52) U.S. Cl. .................. 365/233; 365/194; 365/236; 327/147; 327/156; 327/160
(58) Field of Classification Search ................ 365/233
See application file for complete search history.

(56) References Cited

U.S. PATENT DOCUMENTS 5,745,421 A    4/1998 Pham et al.

(Continued)

*Primary Examiner*—Son L. Mai

(74) *Attorney, Agent, or Firm*—Jones Day; Edward L. Pencoske

(57) ABSTRACT

A method of synchronizing counters in two different clock domains within a memory device is comprised of generating a start signal for initiating production of a running count of clock pulses of a read clock signal in a first counter downstream of a locked loop and delaying the input of the start signal to a second counter upstream of the locked loop to delay the initiation of a running count of control clock pulses by an amount equal to a predetermined delay. Another disclosed method is for controlling the output of data from a memory device comprising deriving from an external clock signal a control clock for operating an array of storage cells and a read clock, both the control clock and the read clock being comprised of clock pulses. A start signal is generated for initiating production of a running count of the read clock pulses in a first counter. The start signal may be produced when a locked loop achieves a lock between the read clock and the control clock. The input of the start signal to a second counter is delayed to delay the initiation of a running count of the control clock pulses. The delay, which may be expressed as an integer number of clock cycles, may be equal to an input/output delay of the memory device. The method may be modified by inputting the start signal to an offset counter before initiating the production of the running count of the read clock pulses in the first counter. The offset counter may be loaded with a value equal to a programmed latency less a synchronization overhead. Once the running counts are initiated, each time a read command is received, a then current value of the running count of control clock pulses from the second counter is latched or held. The held value is compared to the running count of read clock pulses from the first counter, with the read clock signal being used to output data in response to the comparison. Apparatus for implementing the disclosed methods are also disclosed. Because of the rules governing abstracts, this abstract should not be used to construe the claims.

15 Claims, 4 Drawing Sheets

U.S. PATENT DOCUMENTS

| | | |
|---|---|---|
| 5,825,226 A | 10/1998 | Ferraiolo et al. |
| 5,963,502 A | 10/1999 | Watanabe et al. |
| 5,999,580 A | 12/1999 | Sakoda et al. |
| 6,230,245 B1 * | 5/2001 | Manning .................... 711/167 |
| 6,269,051 B1 | 7/2001 | Funaba et al. |
| 6,275,416 B1 * | 8/2001 | Pascucci ................. 365/185.19 |
| 6,300,807 B1 | 10/2001 | Miyazaki et al. |
| 6,337,589 B1 | 1/2002 | Ooishi |
| 6,385,126 B2 | 5/2002 | Jung et al. |
| 6,400,197 B2 | 6/2002 | Lai et al. |
| 6,434,062 B2 * | 8/2002 | Lee ........................... 365/194 |
| 6,434,684 B1 | 8/2002 | Manning |
| 6,437,618 B2 | 8/2002 | Lee |
| 6,621,762 B1 | 9/2003 | Roohparvar |
| 6,687,185 B1 | 2/2004 | Keeth et al. |
| 6,762,974 B1 | 7/2004 | Johnson et al. |
| 6,775,755 B2 | 8/2004 | Manning |
| 6,812,799 B2 | 11/2004 | Kirsch |

\* cited by examiner

METHOD AND APPARATUS FOR INITIALIZATION OF READ LATENCY TRACKING CIRCUIT IN HIGH-SPEED DRAM

CROSS-REFERENCE TO RELATED APPLICATIONS

The present application is a continuation of U.S. patent application Ser. No. 10/910,838 filed Aug. 4, 2004, U.S. Pat. No. 7,065,001, and entitled Method and Apparatus for Initialization of Read Latency Tracking Circuit in High Speed DRAM. The present disclosure is related to U.S. patent application Ser. No. 10/389,807 filed Mar. 18, 2003 and entitled Method and Apparatus for Establishing and Maintaining Desired Read Latency in High-speed DRAM, which application is assigned to the same assignee as the present disclosure.

BACKGROUND OF THE INVENTION

The present invention relates to DRAM circuits and, more specifically, to a circuit and method for maintaining a desired read latency in a high speed DRAM.

A typical DRAM memory system has an external DRAM controller that makes read and write requests to a DRAM memory device. When making a read request, the controller expects data within the memory device to be available on a data bus within a predetermined read latency, which is usually a predetermined number of system clock cycles, which are external to the DRAM device, after a read request is made by the controller, e.g., eight external clock cycles.

Problems with maintaining read data latency in high speed DRAM arise from the necessity to align data with the external clock using an internal delay locked loop (DLL), which generates timing signals, including a read clock signal, for internal DRAM operations. The phase relationship between the external clock, an internal command/address capture clock and the DLL output clock, which is used to generate the read clock signal, is completely arbitrary and dependent on frequency and process, voltage, and temperature (PVT) variations. The command capture clock is delayed relative to the external clock by the clock receiver and other clock distribution delays. The DLL is back timed relative to the external clock by the delay of the data output circuits, but receives its input from an internal clock receiver and also has adjustments made to its output signals that are not synchronized with the external clock. A difference in phase near or greater than a complete clock cycle creates difficulty in controlling timing between the command/address capture clock domain and the DLL clock domain.

Internally the DRAM memory device has its own DLL driven clock system that receives the external clock signal and develops from the external clock several different internal clock signals, including a read clock signal, for internal operation of the memory device. The internal clock system of known, high speed memory devices produces at least two clock domains. The first clock domain represents the timing used in the bulk of the logic circuits and to drive the memory array. The timing for the first domain is produced from the internal clock receiver, which is buffered from the external free running system clock. The phase of the clock signal in the first domain relative to the external clock is dependent upon delays in the clock receiver that receives the external clock signal. The second domain, also derived from the external system clock, represents the timing of a back-timed read clock signal. This clock domain is produced by the delay locked loop DLL and associated clock trees. This second clock domain produces a read clock for operating data read latches. The read clock is provided to the read latch with a desired phase relationship relative to the external system clock. The second clock domain compensates for delays in the data output path to produce a read clock signal that operates the output data latches to achieve a specified phase alignment with the external system clock.

Neither of these two clock domains accurately reflects the timing of the external system clock, particularly at high frequencies of operation. The timing of the clock signals in the two domains may crisscross one another during memory device operation due to process, voltage and temperature (PVT) variations. Consequently, a problem may arise in that the clock domain responsible for delivery of read data to an output latch may cause this data to be delivered at a different time from when the back-timed read clock for latching that data is present at the latch, or when the data is actually required to be driven to an external bus.

To meet a specified read latency the memory device must be able to count clock signals following receipt of a READ command and activate the output latch and data driver to latch output data with the back-timed read clock and drive the bus at the precise time necessary to produce the specified read latency.

Because the amount of read clock back-timing relative to the data availability becomes indeterminate during high speed operation, it is very difficult to control the read clock and guarantee a correct data output and a specific read latency as measured in external clock cycles.

One solution to these problems is disclosed in U.S. patent application Ser. No. 10/389,807 entitled Method and Apparatus for Establishing and Maintaining Desired Read Latency in High-Speed DRAM which is assigned to the same assignee as the present invention. That document discloses a method and apparatus for managing the variable timing of internal clock signals derived from an external clock signal to compensate for uncertainty and variations in the amount of read clock back timing relative to data flow to achieve a specified read latency. A reset signal is generated at DRAM initialization and starts a first counter, which counts external clock cycles, and is also passed through a slave delay line of a delay lock loop to start a second counter. The counters run continuously once started and the difference in count values represent the internal delay as an external clock signal passes through the delay lock loop to produce an internal read clock signal. An internal read latency value is used to offset either counter to account for the internal read latency of the DRAM circuit. Once the non-offset counter is equivalent to the offset counter, read data is placed on an output line with a specified read latency and synchronized with the external read clock.

Another solution to these problems is disclosed in U.S. Pat. No. 6,687,185 which discloses an apparatus and method for coordinating the variable timing of internal clock signals derived from an external clock signal to ensure that read data and a read clock used to latch the read data arrive at the data latch in synchronism and with a specified read latency. A read clock is produced from the external clock signal in a delay lock loop circuit and a start signal, produced in response to a read command, is passed through a delay circuit slaved with the delay lock loop so that the read clock signal and a delayed start signal are subject to the same internal timing variations. The delayed start signal is used to control the output of read data by the read clock signal.

BRIEF SUMMARY OF THE INVENTION

One aspect of the present disclosure is a method of synchronizing counters in two different clock domains within a memory device. The method is comprised of generating a start signal for initiating production of a running count of clock pulses of a read clock signal in a first counter downstream of a locked loop and delaying the input of the start signal to a second counter upstream of the locked loop to delay the initiation of a running count of control clock pulses by a predetermined amount.

Another aspect of the present disclosure is a method of controlling the output of data from a memory device. The method is comprised of deriving from an external clock signal a control clock for operating an array of storage cells and a read clock, both the control clock and the read clock being comprised of clock pulses. A start signal is generated for initiating production of a running count of the read clock pulses in a first counter. The start signal may be produced when a locked loop achieves a lock between the read clock and the control clock. The input of the start signal to a second counter is delayed to delay the initiation of a running count of the control clock pulses. The delay may be equal to a time it takes for a signal to propagate through an input/output circuit of the memory device. A value of the running count of the control clock, or a modified value of the running count of the control clock, from the second counter is held in response to a read command. The held value from the second counter is compared to the running count of the first counter. The read clock signal is used to output data from the memory device in response to the comparing.

According to another aspect of the present disclosure, the method may include inputting the start signal to an offset counter before initiating the production of the running count of the read clock pulses in the first counter. The offset counter may be loaded with a value equal to a programmed latency less a synchronization overhead which may be expressed as a number of cycles. Once the running counts are initiated, each time a read command is received, a then current value of the running count of control clock pulses from the second counter is latched or held. The held value is compared to the running count of read clock pulses from the first counter, with the read clock signal being used to output data in response to the comparison.

Another aspect of the present disclosure is directed to a circuit for synchronizing counters in two different clock domains within a memory device comprising a locked loop having a forward path comprising a phase detector, a delay line and a clock distribution circuit. The locked loop has a feedback path comprised of a model of the input/output delay connected between the clock distribution circuit and the phase detector. The looked loop generates a lock signal upon obtaining a lock between a read clock available at the output of the clock distribution circuit and a control clock input to the phase detector. An initialization circuit produces a start signal in response to the lock signal. A first counter downstream of the locked loop produces a running count of clock pulses of the read clock signal in response to the start signal. A second counter upstream of the locked loop produces a running count of clock pulses of the control clock signal in response to the start signal. A delay circuit is positioned between the initialization circuit and the second counter for delaying the initiation of the production of the running count of clock pulses in the second counter. The circuit may be used for controlling the output of data from a memory device by adding a circuit, e.g., a latch, for holding a then current value of the running count of clock pulses in response to a read command; a comparator for comparing the held current value of the second counter to the running count of the first counter; and a data output path, responsive to the circuit for comparing and the read clock, for outputting data from the memory device.

According to another embodiment of the present disclosure, an offset counter may be positioned between the initialization circuit and the first counter. The offset counter may be loaded with a value equal to a programmed latency less a synchronization overhead.

The various embodiments of the present disclosure compensate for uncertainty and variation in the amount of read clock back-timing in the DRAM memory device by delivering data to a bus output which is properly timed and synchronized with an external clock to ensure that data is properly delivered to the data bus with a specified read latency.

BRIEF DESCRIPTION OF THE DRAWINGS

For the present disclosure to be easily understood and readily practiced, the present disclosure will now be described, for purposes of illustration and not limitation, in conjunction with the following figures, wherein.

DETAILED DESCRIPTION OF THE INVENTION

Reference will now be made in detail to certain embodiments of the present disclosure, examples of which are illustrated in the accompanying drawings. Those of ordinary skill in the art will understand that the figures and descriptions of the present disclosure included herein illustrate and describe elements that are of particular relevance to the present disclosure, while eliminating for the sake of clarity other elements found in typical solid-state memories or memory-based systems.

Figure 1:
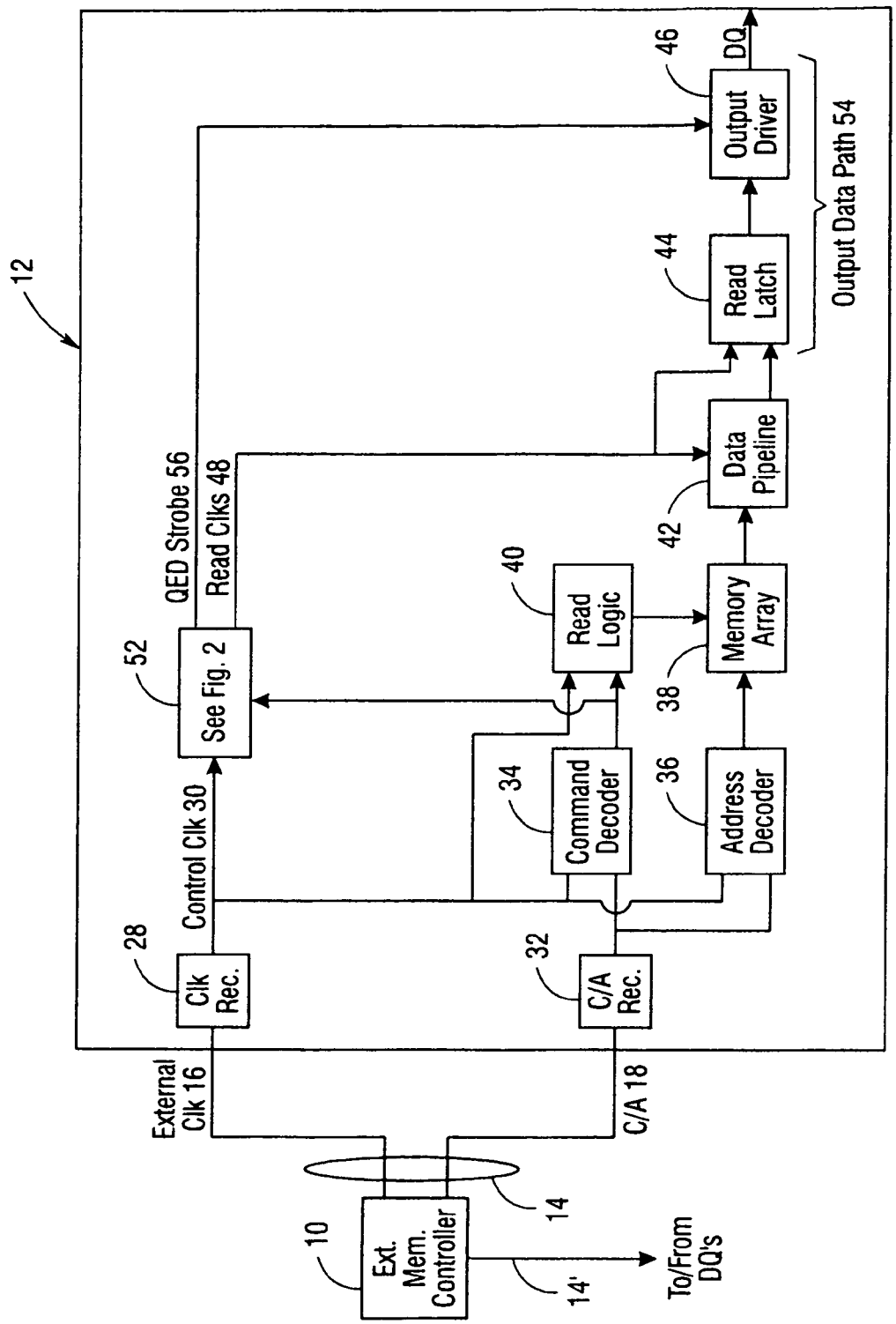
FIG. 1 is a block diagram of a memory device employing one embodiment of the present disclosure.

FIG. 1 illustrates an external memory controller 10 in communication with a memory device 12 through buses 14, 14'. Memory device 12 may include any of the known high-speed solid state memory devices including, but not limited to, various types of DRAM memories. The bus 14 is comprised of a line for carrying an external clock signal 16 ("external" with respect to memory device 12) and command/address lines 18 while bus 14' is a data bus. Buses 14, 14' may be a single bus in certain systems. Those of ordinary skill in the art will recognize that many different types of bus configurations are possible. The present invention is not intended to be limited by any particular type of bus configuration. Those of ordinary skill in the art will recognize that many DQs are provided on the memory device 12 and that the data bus 14' is a multi-line bus, although a single DQ is shown in memory device 12 and a single line is shown within data bus 14'.

The external clock signal 16 is received by a clock receiver 28 which receives and buffers the external clock signal 16 to produce a control clock signal 30. A command and address receiver 32 receives and buffers command and address signals appearing on bus 14. A command decoder 34 is responsive to the command/address receiver 32 for latching and decoding incoming commands from the memory controller 10. An address decoder 36 is provided for latching and decoding incoming addresses from external memory controller 10.

When a read command is decoded by the command decoder 34, that command is used to initialize a read operation on a memory array 38. A read operation is initiated through the read logic 40 which operates the memory array 38 to read out data from one or memory addresses identified by the address decoder 36. The command decoder 34, addressed decoder 36 and read logic 40 are driven by the control clock 30.

Data output from the memory array 38 is input to a data pipeline 42. Data output from the data pipeline 42 is received by a read latch 44 which, in turn, provides the data to an output driver 46 for driving an output pad DQ. Both the data pipeline 42 and read latch 44 are driven by read clocks 48.

Figure 2:
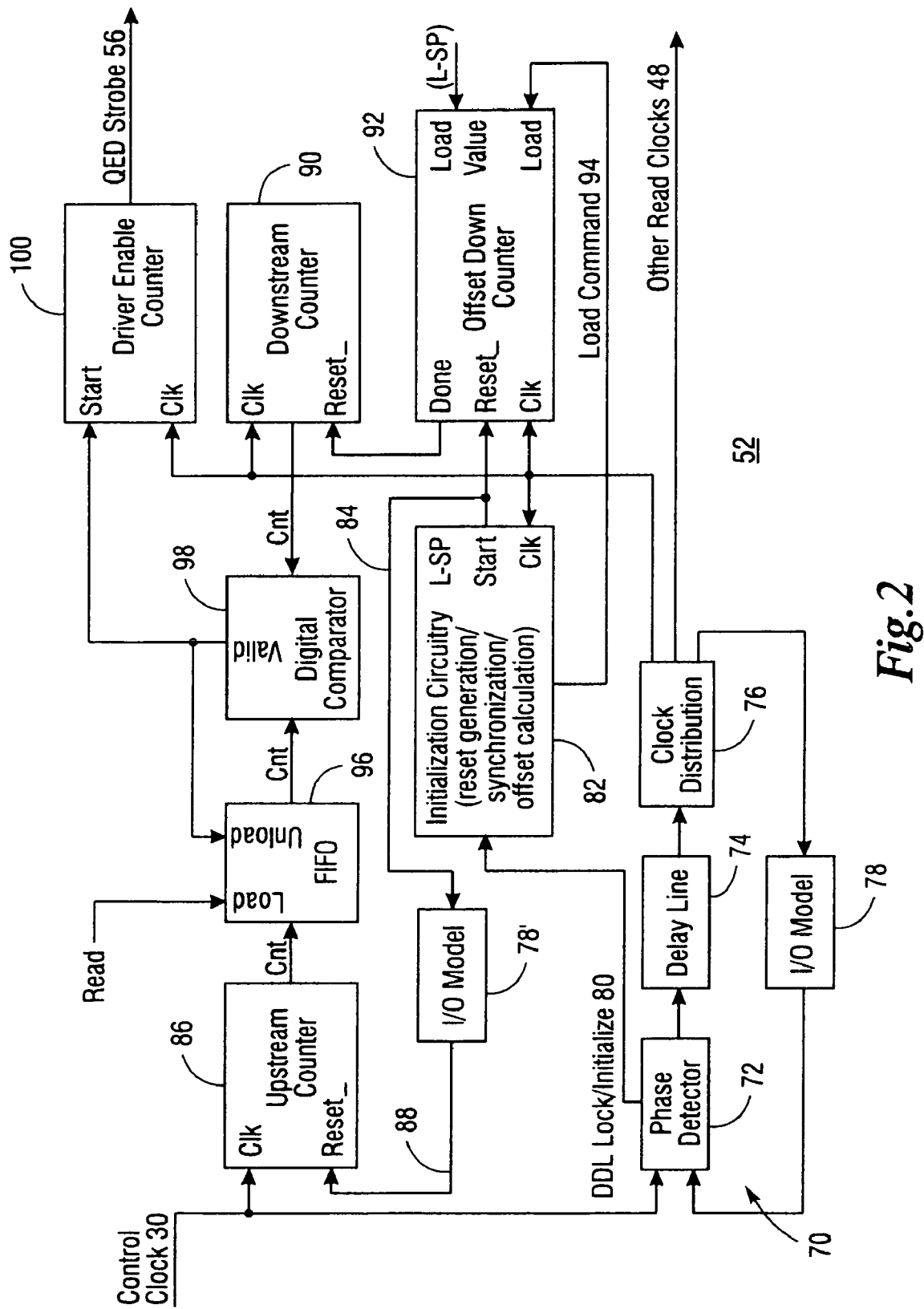
FIG. 2 is a detailed block diagram of a circuit for implementing an embodiment of the present disclosure.

The read clocks 48 are produced by a circuit 52 which includes a locked loop, shown in FIG. 2, such that the control clock 30 is on one side, the upstream side, of the locked loop while the read clocks 48 are on the other side of the locked loop, referred to as the downstream side. The phase locked loop as used herein refers to a DLL, PLL or any other clock alignment circuit. The control clock 30 represents one clock domain while the read clocks 48 represent another clock domain. It is important that the read latch 44 be driven by the read clocks 48 in a manner so that the data is presented on the data output pad DQ with a read latency which has been anticipated by the external memory controller 10. If the data is not provided at the DQ with the proper read latency, i.e., it is presented sooner than or later than when the external memory controller 10 expects to receive it, the data will be corrupted and unusable. It is therefore important to establish the proper read latency. The establishment of the proper read latency is complicated by the fact that data is output from the memory array 38 in response to a clock (control clock 30) which is in a different clock domain than the read clocks 48 which are used to drive the data to the output driver 46 and ultimately on to the data output pad DQ.

Those of ordinary skill in the art will recognize that the read latch 44 and output driver 46 form an output data path 54. Only one output data path 54 is illustrated in FIG. 1 although an actual memory device 12 would have a plurality of such output data paths 54 to enable data to be output in a parallel manner on a plurality of data output pads DQ. Additionally, in some devices, the pads DQs are also used for write operations in which data output from the external memory controller 10 is intended to be written into memory array 38. For purposes of simplicity, the data input paths and the various logic needed to operate the memory array 38 for write operations are not shown in FIG. 1.

Completing the description of FIG. 1, a QED strobe signal 56 is produced by the circuit 52 as described below. The QED strobe signal 56 is used to enable output driver 46. The QED strobe signal 56 is in sync with the read clocks 48 as will be described below.

In FIG. 2, the circuit 52 is shown in greater detail. The circuit 52 is comprised of a locked loop 70. The locked loop 70 has a forward path comprised of a phase detector 72, a delay line 74 and a clock distribution circuit or clock distribution tree 76 which produces a plurality of read clock signals. The locked loop 70 is also comprised of a feedback path comprised of an input/output model 78 connected between the clock distribution circuit 76 and one input of the phase detector 72. The phase detector 72 receives the control clock signal 30 and, via the feedback path, one of the plurality of read clocks. The locked loop 70 defines an upstream side which is driven by one clock domain, i.e., the control clock signal 30, as well as a downstream side which is driven by another clock domain, i.e., the plurality of read clocks. The locked loop 70 is of a known construction and operation and is therefore not further described herein.

Figure 3:
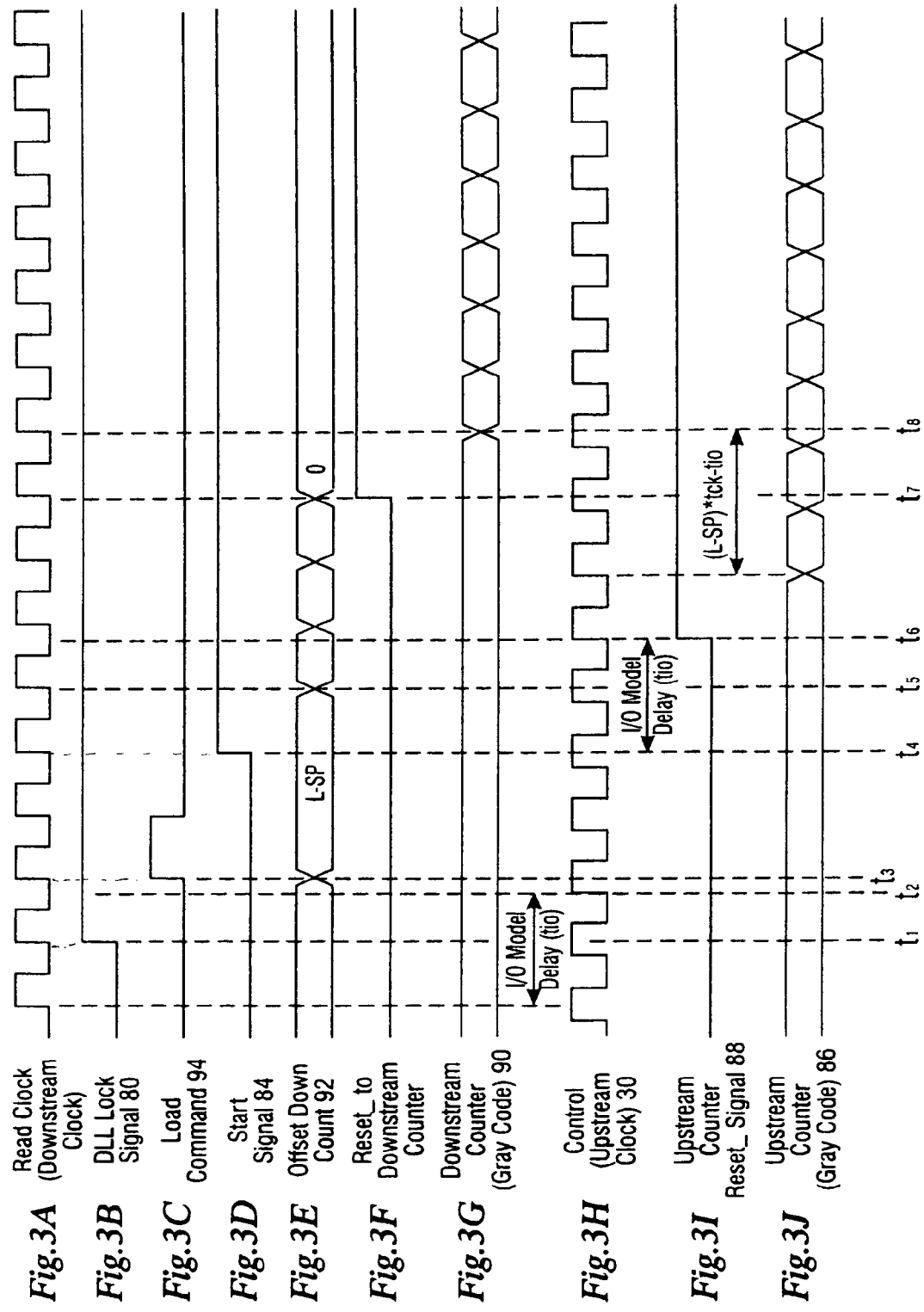
FIGS. 3A-3J are a timing diagram of various signals present in the circuit of FIG. 2.

The phase detector 72 produces a lock signal 80 which is input to an initialization circuit 82. The initialization circuit 82 also receives one of the read clock signals from the clock distribution circuit 76. The purpose of the initialization circuit 82 is to produce a start signal 84 in response to the lock signal 80. Turning briefly to FIG. 3, the read clock signal input to the initialization circuit 82 is shown in FIG. 3A. The lock signal 80 which is also input to the initialization circuit 82 is shown in FIG. 3B. As seen in FIG. 3B, the lock signal goes high, or otherwise changes state, at time t1. At time t4 the start signal 84 illustrated in FIG. 3D goes high. Thus, the initialization circuit 82 is effectively responsible for delaying and synchronizing the lock signal 80 from time t1 to time t4, and thereafter allowing the lock signal 80 to propagate as the start signal 84.

The start signal 84, in one embodiment, is input to a first or downstream counter 90 through an offset down counter 92 although, in other embodiments, the offset down counter 92 may be eliminated. Both the downstream counter 90 and the offset down counter 92 receive one of the plurality of read clock signals. The offset down counter also receives a load command 94 from the initialization circuit 82. Turning to FIG. 3C, it is seen that the initialization circuit 82 produces the load command 94 at time t3. Thus, the load command 94 is a pulse produced after a time delay measured from time t1 to time t3 upon the initialization circuit's 82 receipt of the lock signal 80. The initialization circuit 82 may be implemented using a state machine. The load command 94 causes the offset down counter to load a value which is a program latency L minus a synchronization overhead (SP). That can be seen in FIG. 3E. After receiving the load command, the offset down counter 92 begins counting clock pulses at time t5 upon receipt of the first rising edge of the read clock shown in FIG. 3A after receipt of the start signal 84 illustrated in FIG. 3D. After the offset down counter 92 has counted down from the loaded value, as shown at time t7 in FIG. 3E, a "done" signal is produced which is input to a reset input terminal of the downstream counter 90 as shown in FIG. 3F. That causes the downstream counter 90 to begin counting clock pulses of the read clock signal at time t8.

The start signal 84 is also input into another I/O model 78'. The I/O model 78' introduces the same amount of delay as the I/O model 78, namely, the time necessary for a signal to propagate through the I/O circuit of the device. The output of the I/O model 78' is input to a reset input terminal of a second or upstream counter 86. Referring again to FIG. 3, the start signal 84 shown in FIG. 3D is input to the I/O model 78' which produces the upstream counter reset signal 88 shown in FIG. 3I, synchronized to the control clock 30, at time t6 after the delay imposed by the I/O model 78'. The upstream counter 86 receives the control clock 30 and thus is producing a running count of the clock pulses comprising the control clock 30. That running count is initialized by the upstream counter reset signal 88. When the upstream counter 86 receives the upstream counter reset signal 88 shown in FIG. 3I, the upstream counter 86 begins counting the clock pulses of the control clock 30 as shown in FIG. 3J, upon receipt of the next rising clock edge. The upstream counter 86 thus produces a running count of clock pulses of the control clock signal 30 in response to the start signal 84 after a delay introduced by I/O model 78'.

By time t8, both the upstream counter 86 and the downstream counter 90 have received signals at their respective reset input terminals and are each producing a running count; the upstream counter 86 is producing a running count of the pulses of the control clock 30 while the downstream counter 90 is producing a running count of the pulses of the read clock.

When a read command is received and decoded by the command decoder 34 of FIG. 1, the read command or other appropriate signal is sent to a FIFO 96. The purpose of the FIFO 96 is to latch or otherwise hold a then current value of the running count of the upstream counter 86. That held value from the upstream counter 86 is compared by a comparator 98 to the running count of the downstream counter 90. When the two values are equal, or some other known relationship is reached, a "valid" signal is produced. The "valid" signal is input to an unload input terminal of the FIFO 96 and a driver enable counter 100. The driver enable counter 100 produces the QED strobe signal 56 which is used to enable the output driver 46. The construction and operation of the driver enable counter 100 is known in the art and is not described further herein. After the output driver 46 is enabled, the read clock signal may be used to output data from the memory device. Thus, the output of data is in response to the read clock signal and the digital comparator 98.

In the current disclosure, the counters 86 and 90 are initialized such that the upstream count value leads the downstream count value by an integer number of clock cycles minus the delay through the I/O model 78' which, as previously stated, is the same as the delay of I/O model 78, namely, the time it takes for a signal to propagate through the I/O circuit of the device. By establishing this known relationship between the counters, the time when the output driver enable signal is required to synchronize the DRAM output data with the external clock 16 can be determined.

The current disclosure establishes the relationship between the upstream counter 86 and the downstream counter 90 by sending a reset signal 88 that is synchronized to the upstream counter after passing through the I/O model 78'. Thus, in addition to providing a method and apparatus for controlling the output of data from memory device 12, the present disclosure provides a method and apparatus for synchronizing counters in two different clock domains within a memory device.

Figure 4:
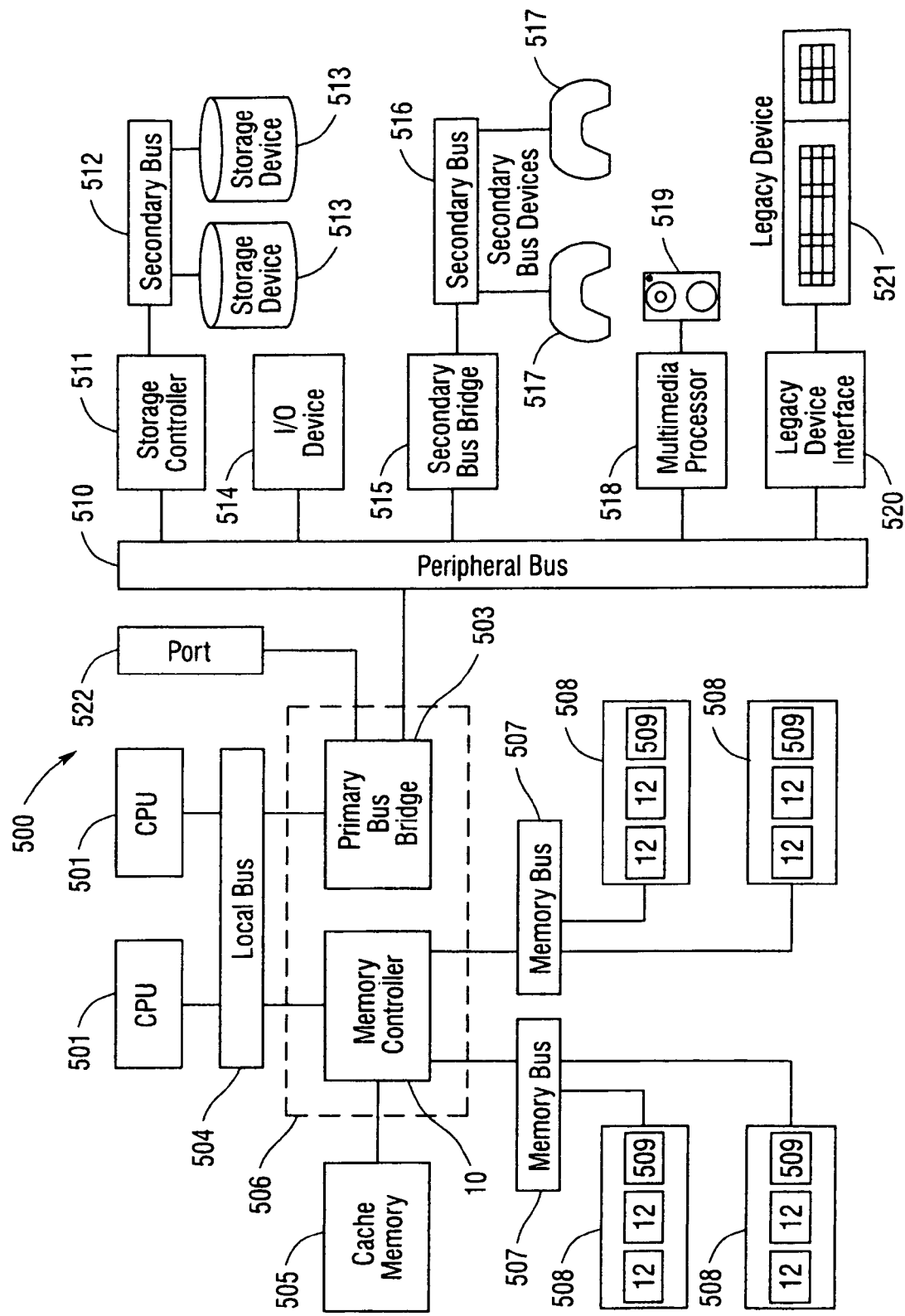
FIG. 4 is a system employing memory devices employing the present disclosure.

FIG. 4 illustrates an exemplary processing system 500 that utilizes DRAM memory device 12 in accordance with the embodiments of the present invention disclosed above in FIGS. 1-3. FIG. 4 depicts an exemplary personal computer or work station architecture. The processing system 500 includes one or ore processors 501 coupled to a local bus 504. A memory controller 10 and a primary bus bridge 503 are also coupled to the local bus 504. The processing system 500 may include multiple memory controllers 10 and/or multiple primary bus bridges 503. The memory controller 10 and the primary bus bridge 503 may be integrated as a single device 506.

The memory controller 10 is also coupled to one or more memory buses 507. Each memory bus accepts memory components 508 that include at least one memory device 12. The memory components 508 may be a memory card or a memory module. Examples of memory modules include single inline memory modules (SIMMs) and dual inline memory modules (DIMMs). The memory components 508 may include one or more additional devices 509. For example, in a SIMM or DIMM, the additional device 509 might be a configuration memory, such as serial presences detect SPD memory. The memory controller 502 may also be coupled to a cache memory 505. The cache memory 505 may be the only cache memory in the processing system. Alternatively, other devices, for example, processors 501 may also include cache memories, which may form a cache hierarchy with cache memory 505. If the processing system 500 includes peripherals or controllers, which are bus masters or which support direct memory access DMA, the memory controller 10 may implement a cache coherency protocol. If the memory controller 10 is coupled to a plurality of secondary memory buses 516, each secondary memory bus 516 may be operated in parallel, or different address ranges may be mapped to different memory buses 507.

The primary bus bridge 503 is coupled to at least one peripheral bus 510. Various devices, such as peripherals or additional bus bridges may be coupled to the peripheral bus 510. These devices may include a storage controller 511, a miscellaneous I/O device 514, a secondary bus bridge 515, a multimedia processor 518, and a legacy device interface 520. The primary bus bridge 503 may also be coupled to one or more special purpose high-speed ports 522. In a personal computer, for example, the special purpose port might be the Accelerated Graphics Port AGP, used to couple a high performance video card to the processing system 500.

The storage controller 511 couples one or more storage devices 513, via a storage bus 512, to the peripheral bus 510. For example, the storage controller 511 may be a SCSI controller and storage devices 513 may be SCSI discs. The I/O device 514 may be any type of peripheral. For example, the I/O device 514 may be a local area network interface, such as an Ethernet card. The secondary bus bridge 515 may be used to interface additional devices 517 via a secondary bus 516 to the processing system. For example, the secondary bus bridge 515 may be a universal serial port USB controller used to couple USB devices 517 via bus 516 to the processing system 500. The multimedia processor 518 may be a sound card, a video capture card, or any other type of media interface, which may also be coupled to an additional device such as speakers 519. The legacy device interface 520 is used to couple legacy devices 521, for example, older style keyboards and mice, to the processing system 500.

The processing system 500 illustrated in FIG. 4 is only an exemplary processing system with which the present disclosure may be used. While FIG. 4 illustrates a processing architecture especially suitable for a general purpose computer, such as a personal computer or a workstation, it should be recognized that well-known modifications could be made to configure the processing system 500 to become more suitable for use in a variety of applications. For example, many electronic devices that require processing may be implemented using a simpler architecture that relies on a CPU 501 coupled to memory components 508. These electronic devices may include, but are not limited to, audio/video processors and records, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the present invention has been described in connection with preferred embodiments thereof, those of ordinary skill in the art will recognize that many modifications and variations are possible. The present invention is intended to be limited only by the following claims and not by the foregoing description which is intended to set forth the presently preferred embodiment.

What is claimed is:

1. A combination of circuits for controlling two counters in different clock domains within a memory device, comprising:
   an initialization circuit responsive to a lock signal and a read clock for producing a start signal, said start signal adapted for input to a first counter operating in a read clock domain; and
   an I/O model for receiving said start signal, said I/O model for inputting said start signal after a predetermined delay to a second counter operating in a control clock domain.

2. The combination of claim 1 wherein said start signal is adapted for input to a reset terminal of said first counter, and wherein said start signal is adapted for input after said predetermined delay to a reset terminal of said second counter.

3. The combination of claim 1 wherein said I/O model approximates the time needed for a signal to propagate through an input/output circuit of the memory device.

4. A combination of circuits for controlling two counters in different clock domains within a memory device, comprising:
   an initialization circuit responsive to a lock signal and a read clock for producing a start signal and a load signal;
   an offset counter responsive to said load signal for loading a value into said offset counter, said offset counter responsive to said start signal for counting down from said loaded value so as to produce a done signal adapted for input to a first clock operating in said read clock domain; and
   an I/O model for receiving said start signal, said I/O model for inputting said start signal after a predetermined delay to a second counter operating in a control clock domain.

5. The combination of claim 4 wherein said done signal is adapted for input to a reset terminal of said first counter, and wherein said start signal is adapted for input after said predetermined delay to a reset terminal of said second counter.

6. The combination of claim 4 wherein said I/O model approximates the time needed for a signal to propagate through an input/output circuit of the memory device.

7. The combination of claim 4 wherein said value loaded into said offset counter is a program latency minus a synchronization overhead.

8. A method of synchronizing a first counter located in a read clock domain and a second counter located in a control clock domain of a memory device, said method comprising:
   resetting each of said counters such that said second counter begins counting control clock pulses for a predetermined time period before said first counter begins counting read clock pulses, said predetermined time period being an integer number of clock cycles minus the delay through an I/O model.

9. The method of claim 8 additionally comprising delaying a start signal used to reset said second counter by a time period equal to the delay through said I/O model.

10. The method of claim 8 additionally comprising delaying resetting said first counter by a time period equal to a program latency minus a synchronization overhead.

11. The method of claim 10 wherein said time period equal to a program latency minus a synchronization overhead is loaded into an offset counter which counts down using said read clock pulses, said offset counter producing a done signal for resetting said first counter in response to said counting.

12. A method of synchronizing a first counter located in a read clock domain with a second counter located in a control clock domain of a memory device, said method comprising:
   resetting said first counter after a first time period has timed out; and
   resetting said second counter after a delay period such that the count of said second counter leads the count of said first counter by an integer number of clock cycles minus the delay through an I/O.

13. The method of claim 12 wherein said delay period is equal to the delay through said I/O model.

14. The method of claim 12 wherein said first time period is equal to a program latency minus a synchronization overhead.

15. The method of claim 14 wherein said first time period equal to a program latency minus a synchronization overhead is loaded into an offset counter which counts down using said read clock pulses, said offset counter producing a done signal for resetting said first counter in response to said counting.

* * * * *